United States Patent [19]
Saitoh et al.

[11] Patent Number: 5,422,497
[45] Date of Patent: Jun. 6, 1995

[54] SUPERCONDUCTING DEVICE HAVING LAYERED STRUCTURE COMPOSED OF OXIDE THIN FILM AND INSULATOR THIN FILM

[75] Inventors: Mitsuchika Saitoh; Sou Tanaka; Michitomo Iiyama, all of Osaka, Japan

[73] Assignee: Sumitomo Electric Industries, Ltd., Osaka, Japan

[21] Appl. No.: 171,757

[22] Filed: Dec. 22, 1993

Related U.S. Application Data

[63] Continuation of Ser. No. 732,211, Jul. 19, 1991, abandoned.

[30] Foreign Application Priority Data

Jul. 19, 1990 [JP] Japan .................. 2-191174
Jul. 2, 1991 [JP] Japan .................. 3-188075

[51] Int. Cl.$^6$ ............................................. H01L 29/00
[52] U.S. Cl. ........................................ 257/35; 257/9; 257/30; 257/31; 257/32; 257/33; 257/36; 257/52; 505/190; 505/329
[58] Field of Search .................. 357/4, 5; 257/9, 30, 257/31, 32, 33, 36, 52, 35; 505/190, 329

[56] References Cited

U.S. PATENT DOCUMENTS

| | | | |
|---|---|---|---|
| 4,490,733 | 12/1984 | Kroger | 357/5 |
| 4,499,119 | 2/1985 | Smith | 427/63 |
| 4,970,395 | 11/1990 | Kruse, Jr. | 250/336.2 |
| 5,015,623 | 5/1991 | Scholten | 505/1 |

FOREIGN PATENT DOCUMENTS

| | | |
|---|---|---|
| 0329507 | 8/1989 | European Pat. Off. . |
| 0342038 | 11/1989 | European Pat. Off. . |
| 0430798 | 6/1991 | European Pat. Off. . |

OTHER PUBLICATIONS

"Fabrication of thin-film type Josephson junctions using a Bi-Sr-Ca-Cu-O/Bi-Sr-Cu-O/Bi-Sr—Ca-Cu-O Structure" by K. Mizuno et al., Dec., 1989.

"Monolithic Device Fabrication Using High-Tc Superconductor" by Yoshida et al., p. 283, Dec. 1988.

Primary Examiner—Robert P. Limanek
Assistant Examiner—Valencia Martin Wallace
Attorney, Agent, or Firm—Helfgott & Karas

[57] ABSTRACT

A superconducting device includes a first thin film of oxide superconductor material formed on a substrate, a second thin film of insulator material stacked on the first thin film of oxide superconductor material, and a third thin film of oxide superconductor material formed on the second thin film of insulator material. The second thin film of insulator material is formed of an amorphous oxide including the same constituent elements as those of the oxide superconductor material of the first thin film. The second thin film of insulator material is formed by heat-treating the first thin film of oxide superconductor material in a gaseous atmosphere bringing a surface of the oxide superconductor material into an amorphous condition, after the first thin film of oxide superconductor material has been formed on the substrate.

3 Claims, 3 Drawing Sheets

FIGURE 1D
FIGURE 1DD
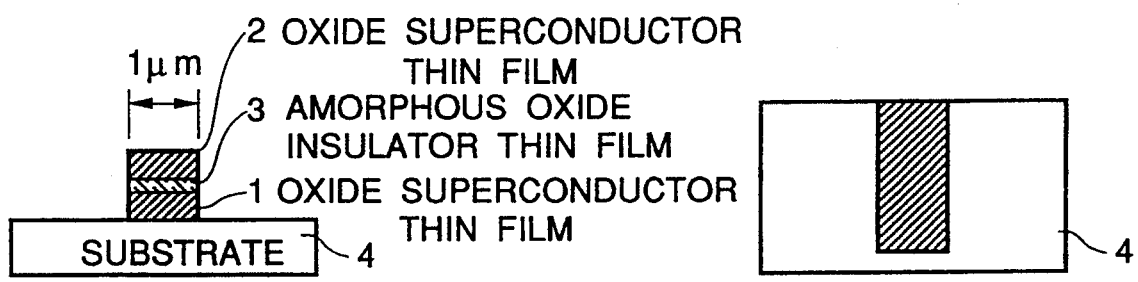
FIGURE 1E
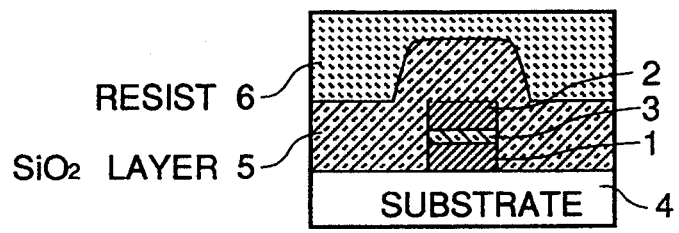
FIGURE 1F
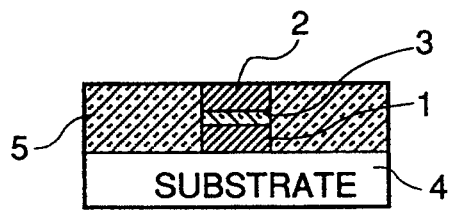
FIGURE 1G
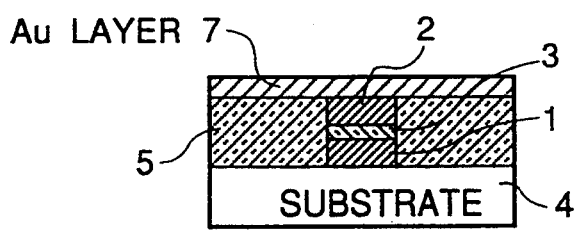

SUPERCONDUCTING DEVICE HAVING LAYERED STRUCTURE COMPOSED OF OXIDE THIN FILM AND INSULATOR THIN FILM

This is a continuation of application Ser. No. 07/732,211, filed Jul. 19, 1991, now abandoned.

BACKGROUND OF THE INVENTION

1. Field of the Invention

The present invention relates to a superconducting device and a method for manufacturing the superconducting device. More specifically, the present invention relates to a superconducting device formed of an thin film of oxide superconductor material formed on a substrate and a insulator thin film formed on the oxide superconductor material thin film, and a method for manufacturing the superconducting device.

2. Description of Related Art

In the case of using an oxide superconductor material in a superconducting device, it it necessary to form and stack a thin film of oxide superconductor material, and then, to form a thin film made of, for example, an insulator or a semiconductor, on the thin film of oxide superconductor material. For example, when a superconductor/insulator/superconductor junction called a "tunnel type" Josephson junction is formed by using an oxide superconductor material, it is necessary to sequentially stack a first thin film of oxide superconductor material, a thin film of insulator material, and a second thin film of oxide superconductor material in the named order.

In this tunnel type Josephson junction, the thickness of the insulator material thin film is generally determined by a coherence length of the superconductor material. Since the oxide superconductor materials have a very short coherence length, it is necessary to utilize the thin film of non-superconductor material having the thickness on the order of a few nanometers.

However, if the thin film of oxide superconductor material is exposed to air, both superconductivity and crystallinity thereof will be deteriorated to the extent of about 1 nm depth from its surface. In ordinary cases, when a second thin film is deposited on the thin film of oxide superconductor material, a deposition apparatus different from that used for formation of the thin film of oxide superconductor material is used, and therefore, the thin film of oxide superconductor material is inevitably exposed to air in the course of feeding from one deposition apparatus to another deposition apparatus. Because of this, it has been a conventional practice to heat the thin film of oxide superconductor material at about 700° C. under an ultra high vacuum on the order of $1 \times 10^{-9}$ Torr, before the second thin film is deposited on the thin film of oxide superconductor material.

The thin film of oxide superconductor material subjected to the above mentioned heat-treatment can have a surface of an improved crystallinity, and in addition, it is possible to epitaxially grow the second thin film on the first thin film of oxide superconductor material. However, the heating of the thin film of oxide superconductor material under the above mentioned ultra high vacuum will result in loss of oxygen from the thin film of oxide superconductor material crystal, which will deteriorate or lose the superconduction characteristics.

On the other hand, if the heat treatment is performed in the oxygen atmosphere, no deterioration in superconduction characteristics of the thin film of oxide superconductor material will occur, but the crystallinity of the thin film surface is not improved.

SUMMARY OF THE INVENTION

Accordingly, it is an object of the present invention to provide a superconducting device and a method of manufacturing the same, which have overcome the above mentioned defect of the conventional devices and methods.

Another object of the present invention is to provide a superconducting device having excellent characteristics and including a thin film of oxide superconductor material of excellent superconductivity, and a method of manufacturing the same.

The above and other objects of the present invention are achieved in accordance with the present invention by a superconducting device which includes at least a first thin film of oxide superconductor material formed on a substrate and a second thin film of insulator material stacked on the first thin film of oxide superconductor material, the second thin film of insulator material being formed of an amorphous oxide including the same constituent elements as those of the oxide superconductor material of the first thin film.

According to another aspect of the present invention, there is provided a method for manufacturing the superconducting device which includes at least a first thin film of oxide superconductor material formed on a substrate and a second thin film of insulator material stacked on the first thin film of oxide superconductor material, the second thin film of insulator being formed of an amorphous oxide including the same constituent elements as those of the oxide superconductor material of the first thin film. According to the method present invention, after the first thin film of oxide superconductor material has been formed on the substrate, the first thin film of oxide superconductor material is heat-treated in a gaseous atmosphere bringing a surface of the oxide superconductor material into an amorphous condition.

As seen from the above, the superconducting device in accordance with the present invention is characterized in that the second thin film of insulator formed on the first thin film of oxide superconductor material is formed of an amorphous oxide including the same constituent elements as those of the oxide superconductor material of the first thin film.

Conventionally, the amorphous oxide if such was formed, has been considered as being formed because an oxide superconductor material was exposed to air and as discured herein above had reacted with the air. In other words, the amorphous oxide has been considered to have been formed as the result of the deterioration of the oxide superconductor material of the thin film exposed to air. A precise composition of this amorphous oxide has not yet been clarified, but it has been considered that because the crystal of the oxide superconductor material has been destroyed, the oxide superconductor material has become amorphous. The superconducting device in accordance with the present invention includes, as an insulator layer, the thin film of this amorphous oxide having a controlled thickness suitable for the superconducting device.

Therefore, in the superconducting device in accordance with the present invention, the insulator layer can be easily formed, and the insulator layer will not adversely affect the thin film of the oxide superconductor material, since the thin film of oxide superconductor material and the amorphous oxide are constituted of the same constituent elements.

Furthermore, the method in accordance with the present invention for manufacturing the above mentioned superconducting device of the present invention, is characterized in that after the first thin film of oxide superconductor material is formed on the substrate, the first thin film of oxide superconductor material is heat-treated in a gaseous atmosphere bringing a surface of the oxide superconductor material into an amorphous condition. The gas for bringing the oxide superconductor material into the amorphous condition can be exemplified by $H_2O$ and $CO_2$. In this connection, when the heat-treatment is performed in a gaseous atmosphere including the above exemplified gas, the pressure is preferred to be in the range of $1 \times 10^{-5}$ Torr to $1 \times 10^{-4}$ Torr, and the heating temperature is preferably in the range of 400° C. to 800° C. Under these conditions, the thin film of amorphous oxide can be produced by wasting a few mono-layers of oxide superconductor surface, which are appropriate for a non-superconductor layer in a tunnel type Josephson device composed of an oxide superconductor material. Here, the "mono-layer" is used to mean a layer having a thickness corresponding to one atom.

If the heating temperature becomes high, decomposition or destruction of a surface region of the thin film of oxide superconductor material is facilitated, and therefore, the surface of the oxide superconductor material is quickly brought into the amorphous condition. Therefore, it can be generally said that the higher the heating temperature is, the shorter the required heat-treatment time is. Preferably, the required heat-treatment time is not less than 5 minutes but not greater than 4 hours. However, if the heating temperature is greater than 800° C., the thin film of oxide superconductor material itself is subjected to an adverse influence. In addition, in order to avoid mutual diffusion between adjacent layers, and in order to form a sharp boundary between the thin film of oxide superconductor material and the thin film of amorphous oxide, it is preferred to perform the heat-treatment at a temperature not greater than 600° C. On the other hand, if the heating temperature is less than 400° C., the surface of the oxide superconductor material is not sufficiently brought into the amorphous condition.

In the method of the present invention, it is preferred to additionally heat-treat the thin film of oxide superconductor material in an oxygen atmosphere after the heat-treatment has been performed in the above mentioned gaseous atmosphere. The reason for this that if the heat-treatment is performed in the above mentioned gaseous atmosphere, the superconductivity of the oxide superconductor material is deteriorated in some cases. The deteriorated thin film of oxide superconductor material is improved by the additional heat-treatment in the oxygen atmosphere. This additional heat-treatment is performed under the pressure in the range of preferably 50 Torr to 200 Torr, and at the heating temperature in the range of preferably 400° C. to 500° C.

In the superconducting device and the manufacturing method of the present invention, any arbitrary oxide superconductor material can be used. But, $Y_1Ba_2Cu_3O_{7-x}$ ($0 < x \leq 1$) type oxide superconductor is preferred, since a thin film having a high quality and a good crystallinity can be stably obtained. In addition, $Bi_2Sr_2Ca_2Cu_3O_y$ ($7 \leq y \leq 11$) type oxide superconductor is preferred, since it has a high superconduction critical temperature Tc.

The above and other objects, features and advantages of the present invention will be apparent from the following description of preferred embodiments of the invention with reference to the accompanying drawings.

BRIEF DESCRIPTION OF THE DRAWINGS

FIG. 1A to 1II are diagrammatic sectional views for illustrating various steps of the preferred embodiments of the method in accordance with the present invention for manufacturing a superconducting device.

DESCRIPTION OF THE PREFERRED EMBODIMENTS

Embodiment 1

A Josephson device was formed in accordance with the method of the present invention, by using a MgO substrate and $Y_1Ba_2Cu_3O_{7-x}$ as an oxide superconductor material. The process will be described with reference to FIGS. 1A to 1II.

First, a first thin film 1 of oxide superconductor material, namely $Y_1Ba_2Cu_3O_{7-x}$, was deposited on a (100) surface of a substrate of a MgO substrate 4 by sputtering. The deposition conditions were as follows:

| substrate temperature | 700° C. |
|---|---|
| sputtering gas | |
| Ar | 4.5 SCCM |
| $O_2$ | 0.5 SCCM |
| pressure | $5 \times 10^{-2}$ Torr |
| film thickness | 400 nm |

Figure 1A:
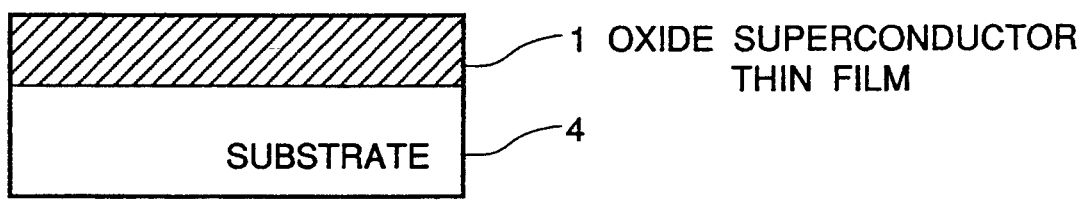
Figure 1B:
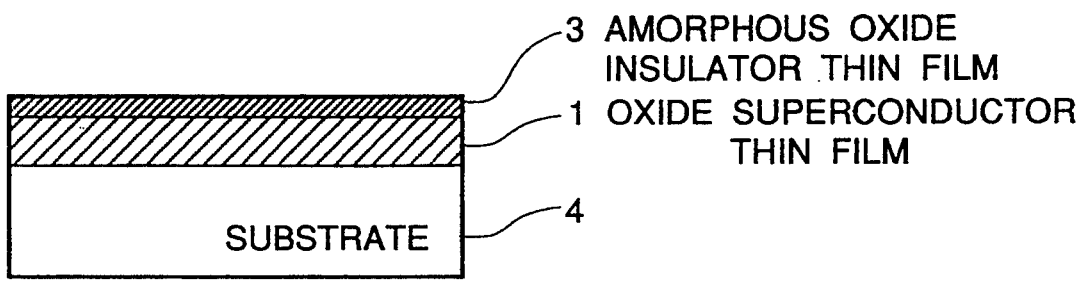

Then, on the deposited first thin film of oxide superconductor material 1, a thin film 3 of amorphous oxide was formed as shown in FIG. 1B under the following conditions:

| atmosphere | water vapor |
|---|---|
| pressure | $5 \times 10^{-5}$ Torr |
| substrate temperature | 700° C. |
| treatment time | 15 minutes |

With the above treatment, thickness of the thin film 3 of amorphous oxide thus formed was estimated a few mono-layers from the top surface. Thereafter, the substrate was allowed to cool until 400° C., and thereafter, an additional heat-treatment was performed under the following conditions:

| atmosphere | $O_2$ |
|---|---|
| pressure | 100 Torr |
| substrate temperature | 400° C. |
| treatment time | 1 hour |

Figure 1C:
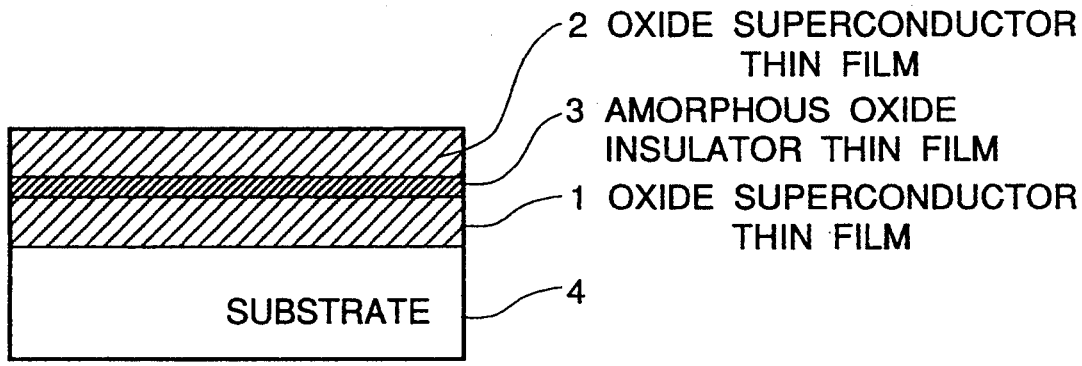

Furthermore, a second thin film 3 of $Y_1Ba_2Cu_3O_{7-x}$ was deposited on the thin film of amorphous oxide 2 as shown in FIG. 1C by a laser ablation method under the following conditions:

| substrate temperature | 630° C. |
|---|---|
| laser beam energy | 0.3 J/cm$^2$ |
| oxygen pressure | 10 Torr |
| film thickness | 400 nm |

Thus, a three-layer structure as shown in FIG. 1C was formed on the substrate of MgO 4. At this stage, the first and second thin films of $Y_1Ba_2Cu_3O_{7-x}$ oxide superconductor material 1 and 2 were formed of a "c"-axis oriented crystal, and had the critical temperature of 85K and 82K, respectively.

Thereafter, the three-layer structure as shown in FIG. 1C was patterned by using a photolithography and an Ar-ion etching, so that a linear pattern having a width of 1 mm was formed as shown in FIGS. 1D and 1DD. FIG. 1DD is a top plan view of the substrate shown in FIG. 1D.

After the above mentioned patterning, a $SiO_2$ layer 5 having a thickness of 800 nm was deposited to cover the whole of the substrate, and a resist layer 6 was deposited to cover the $SiO_2$ layer 5, as shown in FIG. 1E. Then, the deposited resist layer 6 and $SiO_2$ layer 5 were etched back by a reactive ion etching process, until an upper surface of the second thin film of oxide superconductor material 2 was exposed as shown in FIG. 1F.

Figure 1H:
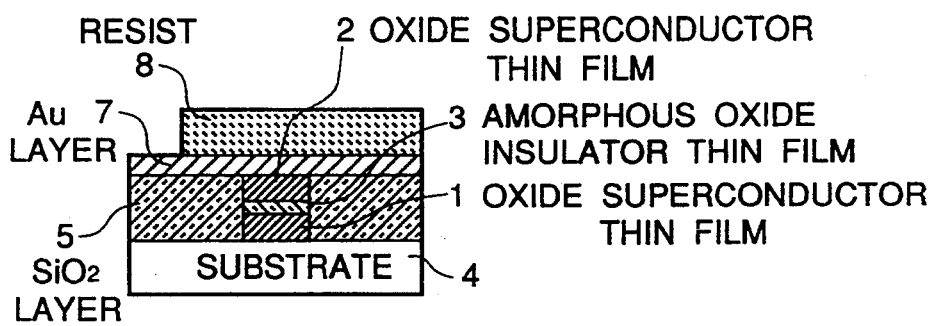
Figure 1H:
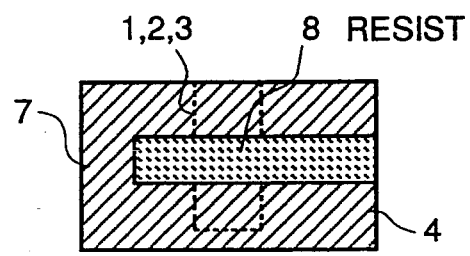

Furthermore, an Au layer 7 was deposited so as to cover the whole of an upper surface of the substrate by a vacuum evaporation, as shown in FIG. 1G. As shown in FIGS. 1H and 1HH, a patterned linear resist 8 was formed on the deposited Au layer 7 so as to intersect the linear patterned three-layer structure in a plan view shown in FIG. 1HH. The patterned linear resist 8 was 1 μm in width.

Figure 1I:
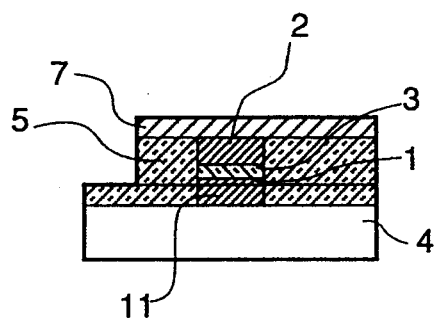
Figure 1I:
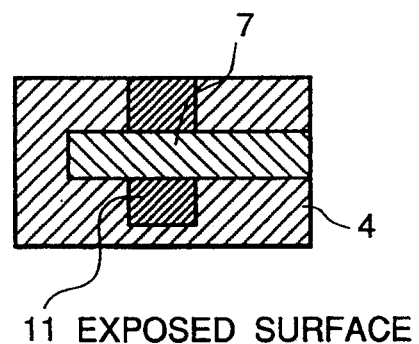

An Ar-ion milling was performed using the patterned linear resist 8 as a mask, until the linear patterned three-layer structure which was not covered with the patterned linear resist 8 becomes about a half in thickness, namely until the lower or first oxide thin film of superconductor material 1 has an exposed upper surface 11, as shown in FIGS. 1I and 1II. In addition, a metallization layer was formed on the exposed upper surface 11 of the lower or first thin film of oxide superconductor material 1.

Thus, a Josephson device was completed, in which the patterned Au layer 7 forms one of a pair of electrodes, and the metallization layer formed on the exposed upper surface 11 of the lower or first thin film of oxide superconductor material 1 forms the other of the pair of electrodes.

Embodiment 2

The three-layer structure as shown in FIG. 1C was formed in the same process as that of the Embodiment 1, except that a thin film 3 of amorphous oxide was formed as shown in FIG. 1B under the following conditions:

| | |
|---|---|
| atmosphere | water vapor |
| pressure | $5 \times 10^{-5}$ Torr |
| substrate temperature | 550° C. |
| treatment time | 1 hour |

In the embodiment 2, the first and second thin films of $Y_1Ba_2Cu_3O_{7-x}$ oxide superconductor material 1 and 2 were formed of a "c"-axis oriented crystal, and had the critical temperature of 86K and 82K, respectively.

The invention has thus been shown and described with reference to the specific embodiments. However, it should be noted that the present invention is in no way limited to the details of the illustrated structures but changes and modifications may be made within the scope of the appended claims.

We claim:

1. A stacked-type Josephson device comprising a substrate, a first thin film of oxide superconductor material formed on said substrate, said first thin film having a top surface brought into an amorphous state so as to provide a second thin film of insulator material stacked on said first thin film of oxide superconductor material such that said second thin film is formed of an amorphous oxide including the same constituent elements as those of the oxide superconductor material of the first thin film, and a third thin film of the same oxide superconductor material as said first thin film of oxide superconductor material, said third film being formed on said second thin film so that a tunnel-type Josephson junction is formed of said first, second and third thin films.

2. A stacked-type Josephson device as claimed in claim 1 wherein the second thin film of amorphous oxide has a thin thickness of a few layers formed of the top surface of the oxide superconductor material of the first thin film.

3. A stacked-type Josephson device as claimed in claim 1 wherein the first thin film of oxide superconductor material is formed of a material selected from the group consisting of $Y_1Ba_2Cu_3O_{7-x}$ $(0<x<1)$ and $Bi_2Sr_2Ca_2Cu_3O_y$ $(7<y<11)$.

* * * * *